(12) United States Patent
Ryu et al.

(10) Patent No.: US 9,643,504 B2
(45) Date of Patent: May 9, 2017

(54) WIRELESS POWER TRANSMISSION SYSTEM, RESONATOR IN WIRELESS POWER TRANSMISSION SYSTEM, AND RESONATOR DESIGN METHOD FOR OPTIMUM POWER DIVISION

(75) Inventors: Young Ho Ryu, Yongin-si (KR); Eun Seok Park, Yongin-si (KR); Sang Wook Kwon, Seongnam-si (KR); Ki Young Kim, Yongin-si (KR); Nam Yun Kim, Seoul (KR); Dong Zo Kim, Yongin-si (KR); Yun Kwon Park, Dongducheon-si (KR); Keum Su Song, Seoul (KR); Chang Wook Yoon, Seoul (KR); Jin Sung Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1020 days.

(21) Appl. No.: 13/614,098

(22) Filed: Sep. 13, 2012

(65) Prior Publication Data

US 2013/0113296 A1 May 9, 2013

(30) Foreign Application Priority Data

Nov. 8, 2011 (KR) .......................... 10-2011-0116025

(51) Int. Cl.
| | |
|---|---|
| *B60L 11/18* | (2006.01) |
| *H02J 5/00* | (2016.01) |
| *G06F 17/50* | (2006.01) |
| *H02J 7/02* | (2016.01) |

(52) U.S. Cl.
CPC ............. *B60L 11/182* (2013.01); *H02J 5/005* (2013.01); *G06F 17/5063* (2013.01); *H02J 7/025* (2013.01); *Y02T 10/7005* (2013.01); *Y02T 10/7072* (2013.01); *Y02T 90/122* (2013.01); *Y02T 90/14* (2013.01); *Y02T 90/16* (2013.01)

(58) Field of Classification Search
CPC ......... B60L 11/182; H02J 5/005; H02J 17/00; H02J 7/00
USPC .......................................................... 307/104
See application file for complete search history.

(56) References Cited

U.S. PATENT DOCUMENTS

| | | | |
|---|---|---|---|
| 2010/0276995 A1 | 11/2010 | Marzetta et al. | |
| 2012/0235509 A1* | 9/2012 | Ueno .................. | H02J 5/005 307/104 |

FOREIGN PATENT DOCUMENTS

| | | | | |
|---|---|---|---|---|
| JP | 2010-063245 A | 3/2010 | | |
| JP | 2010-104203 A | 5/2010 | | |
| JP | 2010-141977 A | 6/2010 | | |
| JP | WO 2011061821 A1 * | 5/2011 | ............. | H02J 5/005 |
| KR | 10-2011-0094382 A | 8/2011 | | |
| KR | 10-2011-0099485 A | 9/2011 | | |
| WO | WO-2010/116441 A1 | 10/2010 | | |

* cited by examiner

*Primary Examiner* — Thienvu Tran
*Assistant Examiner* — David M Stables
(74) *Attorney, Agent, or Firm* — NSIP Law

(57) ABSTRACT

A wireless power transmission system, a resonator in the wireless power transmission system, and a resonator design method for optimum power division are provided. A power receiver of the wireless power transmission system, includes a resonator configured to receive a power from a power transmitter. The power receiver further includes a power supply configured to supply the received power to a load. A figure of merit (FOM) of the resonator corresponds to a power dividing ratio of the power transmitter.

19 Claims, 18 Drawing Sheets

WIRELESS POWER TRANSMISSION SYSTEM, RESONATOR IN WIRELESS POWER TRANSMISSION SYSTEM, AND RESONATOR DESIGN METHOD FOR OPTIMUM POWER DIVISION

CROSS-REFERENCE TO RELATED APPLICATION(S)

This application claims the benefit under 35 U.S.C. §119(a) of Korean Patent Application No. 10-2011-0116025, filed on Nov. 8, 2011, in the Korean Intellectual Property Office, the entire disclosure of which is incorporated herein by reference for all purposes.

BACKGROUND

1. Field

The following description relates to a wireless power transmission system, a resonator in the wireless power transmission system, and a resonator design method for optimum power division.

2. Description of Related Art

Wireless power refers to energy transferred from a wireless power transmitter to a wireless power receiver, for example, through magnetic coupling. A wireless power transmission system includes a source device and a target device. The source device wirelessly transmits power, and the target device wirelessly receives power. The source device may be referred to as a wireless power transmitter, and the target device may be referred to as a wireless power receiver.

The source device includes a source resonator, and the target device includes a target resonator. Magnetic coupling or resonance coupling may be formed between the source resonator and the target resonator.

Due to characteristics of a wireless environment, a distance between a source device and a target device, or matching requirements matching a source resonator and a target resonator, may be changed, which may result in a change in a power transmission efficiency. Additionally, wireless power transmission may not be normally-performed based on a method of designing a target resonator. Accordingly, there is a desire for a design condition of a target resonator to realize optimum wireless power transmission.

SUMMARY

In one general aspect, there is provided a power receiver of a wireless power transmission system, the power receiver including a resonator configured to receive a power from a power transmitter. The power receiver further includes a power supply configured to supply the received power to a load. A figure of merit (FOM) of the resonator corresponds to a power dividing ratio of the power transmitter.

The FOM of the resonator may be determined based on a reference FOM of a source resonator of the power transmitter, and a design constant set in advance. The design constant may include a value within an error margin set in advance.

The design constant may be defined by the following equation:

$$DC = \sqrt{\frac{X}{1-X}},$$

where $$X = \frac{P_D}{P_D + P_R},$$

and where DC denotes the design constant, $P_R$ denotes an amount of power required by a reference device, and $P_D$ denotes an amount of power required by the load.

The reference FOM may be defined by the following equation:

$$U_{ref} = k_{ref}\sqrt{Q_0 Q_{ref}},$$

where $U_{ref}$ denotes the reference FOM, $k_{ref}$ denotes a coupling coefficient of a reference device, $Q_0$ denotes a quality factor of the source resonator, and $Q_{ref}$ denotes a quality factor of the reference device.

The error margin may satisfy the following condition:

$$0.95 \times DC \leq R_{design} \leq 1.05 \times DC$$

where $R_{design}$ denotes the error margin, and DC denotes the design constant.

The FOM of the resonator may be defined by the following equation:

$$U_D = designconstant \times U_{ref},$$

where $$DC = \sqrt{\frac{X}{1-X}},$$

where $$X = \frac{P_D}{P_D + P_R},$$

and where $U_D$ denotes the FOM of the resonator, $U_{ref}$ denotes a reference FOM of a source resonator of the power transmitter, DC denotes a design constant set in advance, $P_R$ denotes an amount of power required by a reference device, and $P_D$ denotes an amount of power required by the load.

The reference FOM $U_{ref}$ may be defined by the following equation:

$$U_{ref} = k_{ref}\sqrt{Q_0 Q_{ref}},$$

where $k_{ref}$ denotes a coupling coefficient of the reference device, $Q_0$ denotes a quality factor of the source resonator, and $Q_{ref}$ denotes a quality factor of the reference device. The amount required by the reference device may be 1 Watt.

The power dividing ratio may include a ratio of an amount of power required by the load to an amount of power required by a reference device. The reference device and the power receiver may receive the power at the same time.

The FOM of the resonator may be determined based on a ratio of an amount of power required by the load to an amount of power required by a reference device.

The amount of the power required by the load may include a value in a range of 85% to 115% of a dissipation power of the load.

In another general aspect, there is provided a method of designing a resonator configured to receive a power from a power transmitter, the method including receiving information on an amount of power required by a load connected to the resonator. The method further includes determining a figure of merit (FOM) of the resonator based on the received information and a power dividing ratio of the power transmitter. The method further includes determining a design parameter of the resonator based on the FOM of the resonator.

The design parameter may include a size of the resonator, or a thickness of a conductor included in the resonator, or a width of the conductor, or a loss of the conductor, or a resistance of the conductor, or an inductance value of the resonator, or any combination thereof.

In still another general aspect, there is provided an apparatus configured to determine a design parameter of a resonator configured to receive a power from a power transmitter, the apparatus including an input unit configured to receive information on an amount of power required by a load connected to the resonator. The apparatus further includes a figure-of-merit (FOM) determining unit configured to determine a FOM of the resonator based on the received information and a power dividing ratio of the power transmitter. The apparatus further includes a design parameter determining unit configured to determine a design parameter of the resonator based on the FOM of the resonator.

Other features and aspects will be apparent from the following detailed description, the drawings, and the claims.

Figure 1:
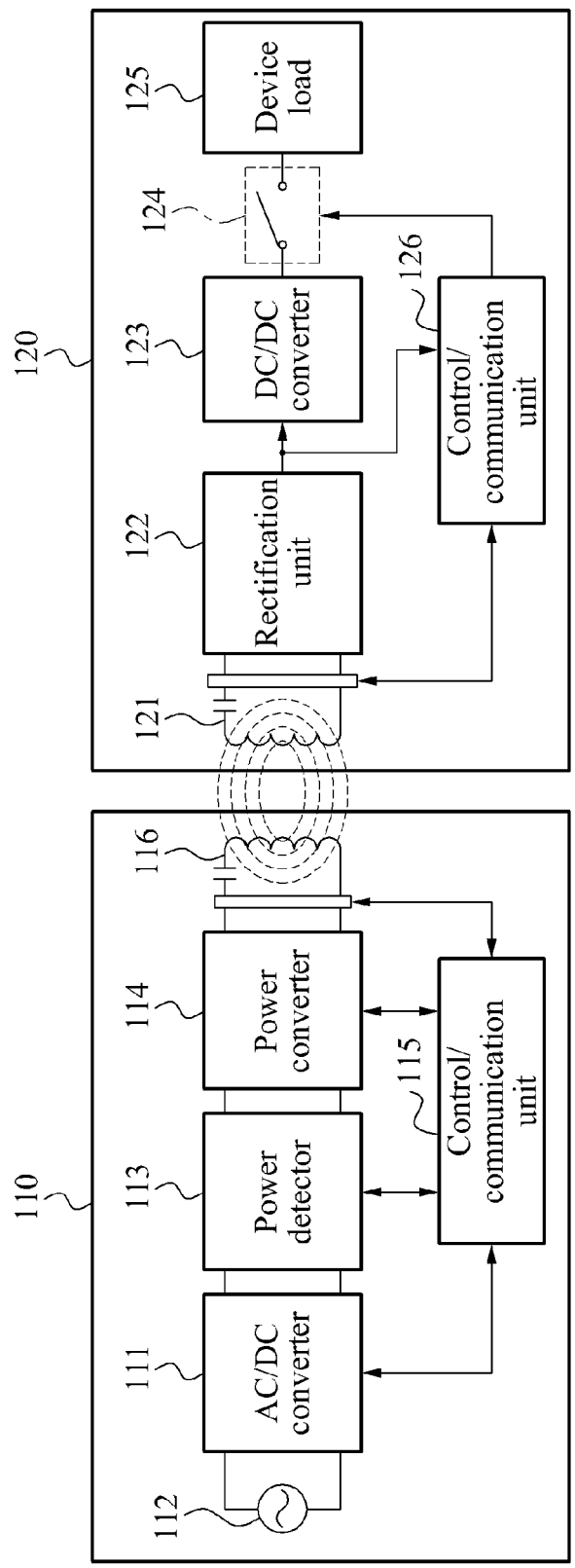
FIG. 1 is a diagram illustrating an example of a wireless power transmission system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 is a diagram illustrating an example of a wireless power transmission and charging system. Referring to FIG. 1, the wireless power transmission and charging system includes a source device 110 and a target device 120. The source device 110 is a device supplying wireless power, and may be any of various devices that supply power, such as pads, terminals, televisions (TVs), and any other device that supplies power. The target device 120 is a device receiving wireless power, and may be any of various devices that consume power, such as terminals, TVs, vehicles, washing machines, radios, lighting systems, and any other device that consumes power.

The source device 110 includes an alternating current-to-direct current (AC/DC) converter 111, a power detector 113, a power converter 114, a control and communication (control/communication) unit 115, and a source resonator 116.

The target device 120 includes a target resonator 121, a rectification unit 122, a DC-to-DC (DC/DC) converter 123, a switch unit 124, a device load 125, and a control/communication unit 126.

The AC/DC converter 111 generates a DC voltage by rectifying an AC voltage having a frequency of tens of hertz (Hz) output from a power supply 112. The AC/DC converter 111 may output a DC voltage having a predetermined level, or may output a DC voltage having an adjustable level by the control/communication unit 115.

The power detector 113 detects an output current and an output voltage of the AC/DC converter 111, and provides, to the control/communication unit 115, information on the detected current and the detected voltage. Additionally, the power detector 113 detects an input current and an input voltage of the power converter 114.

The power converter 114 generates a power by converting the DC voltage output from the AC/DC converter 111 to an AC voltage using a switching pulse signal having a frequency of a few kilohertz (kHz) to tens of megahertz (MHz). In other words, the power converter 114 converts a DC voltage supplied to a power amplifier to an AC voltage using a reference resonance frequency $F_{Ref}$, and generates a wake-up power or a charging power to be used for charging that may be used in a plurality of target devices. The wake-up power may be, for example, a low power of 0.1 to 1 milliwatts (mW) that may be used by a target device to perform communication, and the charging power may be, for example, a high power of 1 mW to 200 Watts (W) that may be consumed by a device load of a target device. In this description, the term "charging" may refer to supplying power to an element or a unit that charges a battery or other rechargeable device with power. Also, the term "charging" may refer supplying power to an element or a unit that consumes power. For example, the term "charging power" may refer to power consumed by a target device while operating, or power used to charge a battery of the target device. The unit or the element may include, for example, a battery, a display device, a sound output circuit, a main processor, and various types of sensors.

Also, the control/communication unit 115 may control a frequency of the switching pulse signal used by the power converter 114.

The control/communication unit 115 may perform out-of-band communication using a communication channel. The control/communication unit 115 may include a communication module, such as a ZigBee module, a Bluetooth module, or any other communication module, that the control/communication unit 115 may use to perform the out-of-band communication. The control/communication unit 115 may transmit or receive data to or from the target device 120 via the out-of-band communication.

The source resonator 116 transfers electromagnetic energy, such as the wake-up power or the charging power, to the target resonator 121 via a magnetic coupling with the target resonator 121.

The target resonator 121 receives the electromagnetic energy, such as the wake-up power or the charging power, from the source resonator 116 via a magnetic coupling with the source resonator 116. Additionally, the target resonator 121 receives various messages from the source device 110 via the in-band communication.

A figure of merit (FOM) of the target resonator 121 satisfies a power dividing ratio of the source device 110. The FOM of the target resonator 121 and the power dividing ratio will be further described with reference to FIGS. 2 through 10.

The rectification unit 122 generates a DC voltage by rectifying an AC voltage received by the target resonator 121.

The DC/DC converter 123 adjusts a level of the DC voltage output from the rectification unit 122 based on a voltage rating of the device load 125. For example, the DC/DC converter 123 may adjust the level of the DC voltage output from the rectification unit 122 to a level in a range from 3 volts (V) to 10 V.

The switch unit 124 is turned on or off by the control/communication unit 126. When the switch unit 124 is turned off, the control/communication unit 115 of the source device 110 may detect a reflected wave. In other words, when the switch unit 124 is turned off, the magnetic coupling between the source resonator 116 and the target resonator 121 is interrupted.

The device load 125 may include a battery. The device load 125 may charge the battery using the DC voltage output from the DC/DC converter 123.

The control/communication unit 126 is activated by the wake-up power. The control/communication unit 126 communicates with the source device 110, and controls an operation of the target device 120.

The rectification unit 122, the DC/DC converter 123, and the switch unit 124 may be referred to as power supply units. Accordingly, the target device 120 includes the target resonator 121 and the power supply units 122, 123 and 124 configured to supply the received power to the device load 125. The device load 125 may be briefly expressed as a load.

Figure 2:
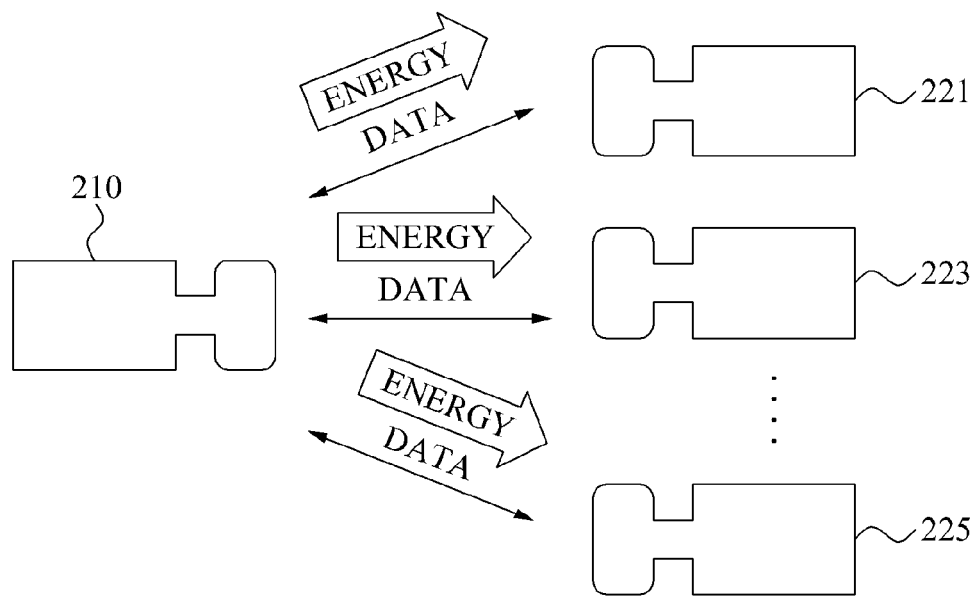
FIG. 2 is a diagram illustrating an example of a multi-target environment.

FIG. 2 illustrates an example of a multi-target environment. Referring to FIG. 2, a source device 210 simultaneously, wirelessly transfers energy and data to target devices, for example, target devices 221, 223, and 225. That is, based on a wireless power transmission employing a resonance scheme, the source device 210 simultaneously charges the target devices 221, 223, and 225.

The target devices 221, 223, and 225 may be of various types. For example, the target device 221 may be a smartphone, a tablet personal computer (PC), and/or an MP3 (Moving Picture Experts Group Audio Layer III) player. Additionally, the target devices 223 and 225 may be of the same type as, or a different type from, the target device 221.

When the target devices 221, 223, and 225 simultaneously receive a power, the power may need to be divided based on an amount of power required by each of the target devices 221, 223, and 225. In this example, each of the target devices 221, 223, and 225 may need to receive the required power. The power required by each of the target devices 221, 223, and 225 may refer to a power used to operate a device load, and/or a power required to completely charge a device load.

When the target device 221 receives the power less than the amount of the power required by the target device 221, the target device 221 may not operate, and/or a long period of time may be required to charge the target device 221. When the target device 221 receives the power greater than the amount of the required power, an error may occur in the target device 221 due to overvoltage or overcurrent. In other words, when the power is not correctly divided in the multi-target environment, a transmission efficiency may decrease, a device may malfunction, and/or the power may be wasted.

Accordingly, there is a need for a wireless power transmission system enabling an optimum power division, while maintaining a maximum power transmission efficiency of the wireless power transmission system. In various examples, a method of designing a target resonator based on a power transmission efficiency and a power division is provided.

Figure 3:
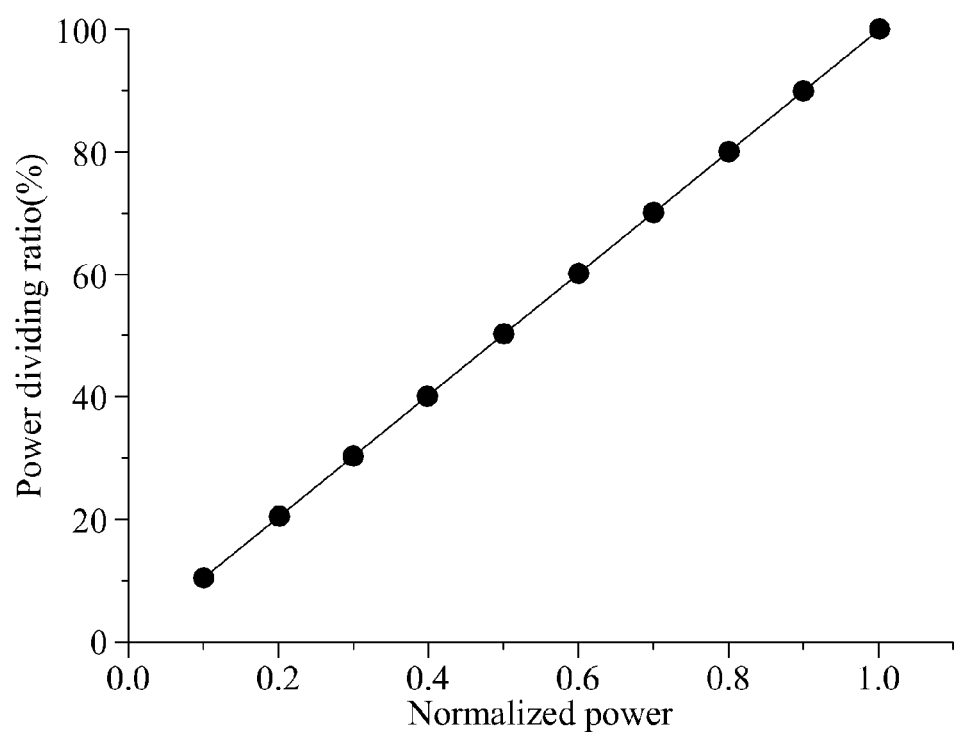
FIG. 3 is a diagram illustrating an example of a ratio of a dissipation power to a total required power in the multi-target environment of FIG. 2.

FIG. 3 illustrates an example of a ratio of a dissipation power to a total required power in the multi-target environment of FIG. 2. Referring to FIG. 3, a horizontal axis represents an amount of normalized power, and a vertical axis represents a power dividing ratio. The amount of the normalized power is obtained by dividing an amount of power to be received by a target device (i.e., the dissipation power), by a total amount of power to be transmitted by a source device (i.e., the total required power).

For example, referring to FIGS. 2 and 3, the source device 210 may transmit a total power of 10 W. Accordingly, when a power of 2 W is received by the target device 221, a power of 3 W is received by the target device 223, and a power of 4 W is received by the target device 225, a normalized power of 0.2 W, a normalized power of 0.3 W, and a normalized power of 0.4 W may be obtained, respectively. Additionally, power dividing ratios for the target devices 221, 223, and 225 may be 20%, 30%, and 40%, respectively.

Accordingly, the power dividing ratios of the source device 210 are obtained by dividing an amount of power to be received by each of the target devices 221, 223 and 225 (i.e., the dissipation power), by a total amount of power to be transmitted by the source device 210 (i.e., the total required power). When the power dividing ratios of the source device 210 are satisfied, an optimum power division may be enabled.

Figure 4:
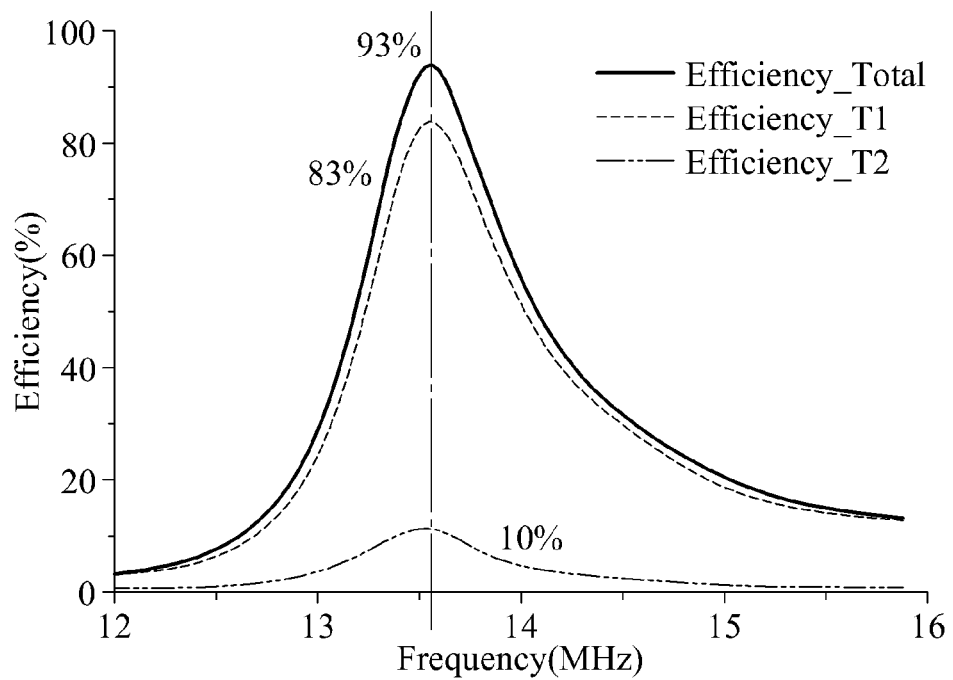
FIGS. 4 and 5 are diagrams illustrating examples of problems occurring when power division is not considered.
Figure 5:
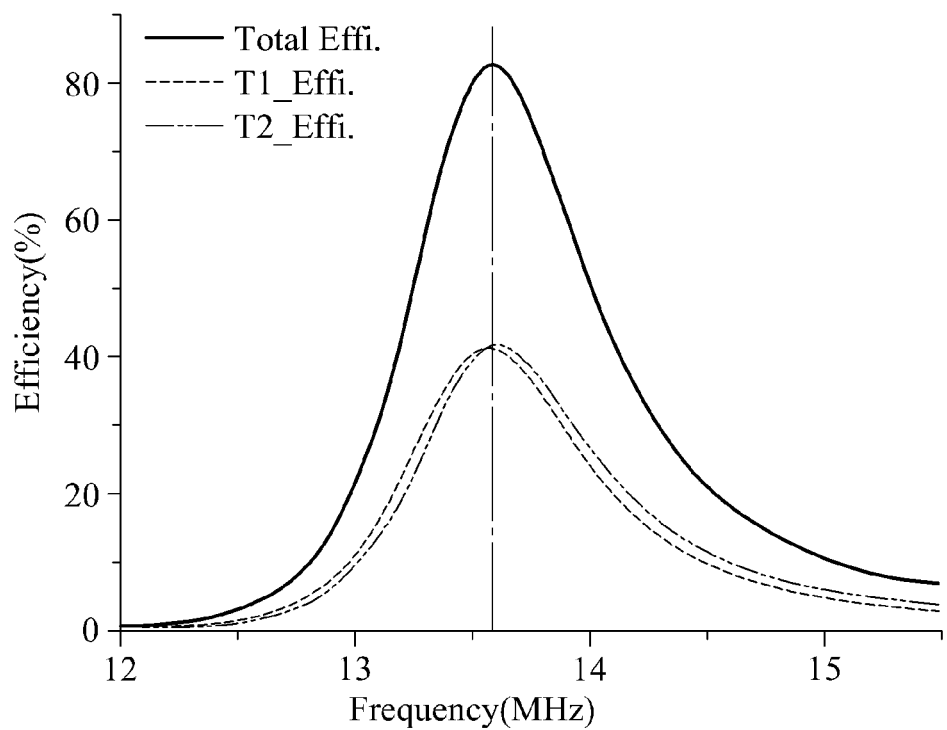

FIGS. 4 and 5 illustrate examples of problems occurring when power division is not considered. FIG. 4 illustrates an example in which a power is not divided correctly when a magnetic field of a source resonator is not uniform. For example, when the magnetic field of the source resonator is not uniform, a power division may be controlled using a matching network; however, an extremely large number of controls may be required. Additionally, when a large number of target devices exist, it may be difficult to divide a power using the matching network.

In a graph of FIG. 4, Efficiency_T1 indicates a power reception efficiency of a target device T1, Efficiency_T2 indicates a power reception efficiency of a target device T2, and Efficiency_Total indicates a total power reception efficiency of the target devices T1 and T2. For example, in a resonance frequency of 13.56 MHz, the Efficiency_T1 may be 83%, but the Efficiency_T2 may be 10%. The Efficiency_Total may be 93%.

FIG. 5 illustrates an example in which a power dividing ratio is not satisfied due to a wrong design of a target resonator, despite a uniform magnetic field of a source resonator. For example, an amount of power required by a target device T1, and an amount of power required by a target device T2, may be 6.5 W and 3 W, respectively. Since an amount of power received by the target device T1 may be almost identical to an amount of power received by the target device T2, a problem may occur in a power division. In an example, when the target device T1 receives a power less than the amount of the required power, it may be impossible to charge the target device T1, and/or a period of time longer than necessary may be required to charge the target device T1. In another example, when the target device T2 receives an extremely high power, the target device T2 may be damaged due to overvoltage or overcurrent, and a total power transmission efficiency may be reduced.

In a graph of FIG. 5, T1_Effi. indicates a power reception efficiency of a target device T1, T2_Effi. indicates a power reception efficiency of a target device T2, and Total_Effi. indicates a total power reception efficiency of the target devices T1 and T2. For example, in a resonance frequency of 13.56 MHz, the T1_Effi. may be 40%, the T2_Effi. may be 40%, and the Total_Effi. may be 80%.

Hereinafter, a resonator for an optimum power division in a multi-target environment, and a method of designing the resonator will be described.

A condition required to satisfy the optimum power division in the multi-target environment is determined based on a FOM of a target resonator. In other words, there is a need to design the FOM of the target resonator to satisfy a power dividing ratio of a power transmitter. For example, when the FOM of the target resonator satisfies the power dividing ratio of the power transmitter, the optimum power division may be realized in the multi-target environment. Hereinafter, a target device in the multi-target environment may be expressed as a target resonator, for convenience of description.

To induce the condition for the optimum power division, the power dividing ratio may be determined based on the following example of Equation 1:

$$\eta = \frac{\frac{x_n}{(1+x_n)^2} \sum_{n=1}^{N} U_{0n}^2}{1 + \frac{1}{1+x_n} \sum_{n=1}^{N} U_{0n}^2}, \quad \text{[Equation 1]}$$

and $$x_n = \sqrt{1 + \sum_{n=1}^{N} U_{0n}^2}$$

In Equation 1, $\eta$ denotes a total power transmission efficiency in the multi-target environment. The total power transmission efficiency refers to a ratio of a power received by each of target resonators to a power output from a source device.

The power dividing ratio refers to a ratio of a power amount of a load of a first target device to a power amount of a second target device, i.e., a reference device. The first target device and the second target device may receive power at the same time. Hereinafter, the power amount of the load refers to an amount of power required by the load.

Additionally, in Equation 1, N denotes a number of the target resonators. $U_{0n}$ denotes a FOM of an n-th target resonator with respect to the source device. In other words, $U_{0n}$ may be determined by $U_{0n} = \sqrt{Q_0 Q_n} \kappa_{0n}$, in which $Q_0$ denotes a quality factor of a source resonator of the source device, $Q_n$ denotes a quality factor of the n-th target resonator, and $\kappa_{0n}$ denotes a coupling coefficient of the source resonator and the n-th target resonator.

In the multi-target environment, in a condition in which impedance matching is completed, Equation 1 may be expressed as shown in the following example of Equation 2:

$$\eta = \frac{\sum_{n=1}^{N} U_{0n}^2}{\left(1 + \sqrt{1 + \sum_{n=1}^{N} U_{0n}^2}\right)^2} \quad \text{[Equation 2]}$$

The power dividing ratio $\gamma_n$ of the power transmitter may be expressed as shown in the example of Equation 3 below. Hereinafter, the power dividing ratio of the power transmitter may be expressed as a power dividing ratio.

$$\gamma_n = \frac{\text{Efficiency of } n\text{-th target}}{\text{Total Efficiency}} = \frac{U_{0n}^2}{\sum_{n=1}^{N} U_{0n}^2} = \frac{Q_n \kappa_{0n}^2}{\sum_{n=1}^{N} Q_n \kappa_{0n}^2} \quad \text{[Equation 3]}$$

In Equation 3, "Total Efficiency" refers to the total power transmission efficiency of the wireless power transmission system. Additionally, "Efficiency of n-th target" refers to a power reception efficiency of an n-th target resonator.

Referring to Equation 3, the power dividing ratio may be expressed in terms of the FOM of the n-the target resonator. Also, the FOM of the n-th target resonator may be expressed in terms of the quality factor of the n-th target resonator and the coupling coefficient of the source resonator and the n-th target resonator. Based on Equation 3, i.e., the definition of the power dividing ratio, an FOM of a target resonator may be determined. The FOM $U_D$ of the target resonator determined based on the power dividing ratio may be expressed as shown in the following example of Equation 4:

$$U_D = \sqrt{\frac{X}{1-X}} \, U_{ref} = \text{Design Constant} \times U_{ref}, \quad \text{[Equation 4]}$$

$$X = \frac{P_D}{P_D + P_R},$$

and $$DC = \sqrt{\frac{X}{1-X}}$$

In Equation 4, X denotes a normalized power dividing ratio, $P_R$ denotes a reference power amount, $P_D$ denotes a power amount of a load, namely, a device load, and DC denotes a design constant of the target resonator. The reference power amount may refer to a maximum amount of power required by a reference device, for example, 1 W.

The reference device may be a virtual device configured to determine a reference FOM $U_{ref}$ of the source device or the source resonator. Additionally, the reference device may be a predetermined device configured to determine the reference FOM $U_{ref}$.

Referring to Equation 4, the FOM of the target resonator may be determined based on the reference FOM $U_{ref}$ of the source resonator, and a design constant DC set in advance. Additionally, the FOM of the target resonator may be determined based on a ratio $P_D/P_R$ of the power amount of the load connected to the target resonator to the reference power amount, namely, the amount of the power required by the reference device. For example, when a dissipation power of a load, or a maximum amount of power that may be received by the load, is 100 W, the ratio $P_D/P_R$ may be determined to be in a range of 85 W to 115 W. That is, the power amount of the load to determine the FOM of the target resonator may be in the range of 85% to 115% of the dissipation power of the load.

The reference FOM $U_{ref}$ in Equation 4 may be expressed as shown in the following example of Equation 5:

$$U_{ref} = k_{ref}\sqrt{Q_0 Q_{ref}} \quad \text{[Equation 5]}$$

In Equation 5, $k_{ref}$ denotes a coupling coefficient of the reference device, $Q_0$ denotes the quality factor of the source resonator, and $Q_{ref}$ denotes a quality factor of the reference device.

The FOM $U_D$ of the target device or the target resonator may be expressed as shown in the following example of Equation 6, similarly to Equation 5:

$$U_D = k_D\sqrt{Q_0 Q_D} \quad \text{[Equation 6]}$$

Referring to Equation 6, a value of the FOM $U_D$ satisfying Equation 4 may be determined by adjusting a coupling coefficient $k_D$ of the target resonator, and a quality factor $Q_D$ of the target resonator.

The coupling coefficient $k_D$ and the quality factor $Q_D$ in Equation 6 may be expressed as shown in the following examples of Equations 7 and 8, respectively:

$$k_D = \frac{M}{\sqrt{L_0 L_D}} \quad \text{[Equation 7]}$$

$$Q_D = \frac{\omega L_D}{R_{D\_rad} + R_{D\_loss}} \quad \text{[Equation 8]}$$

In Equation 7, M denotes a mutual inductance between the source resonator and the target resonator, $L_0$ denotes an inductance value of the source resonator, and $L_D$ denotes an inductance value of the target resonator. In Equation 8, $\omega$ denotes a value determined by representing a resonance frequency as an angular speed, $R_{D\_rad}$ denotes a conductor resistance value of the target resonator, and $R_{D\_loss}$ denotes a conductor loss value of the target resonator.

Figure 6:
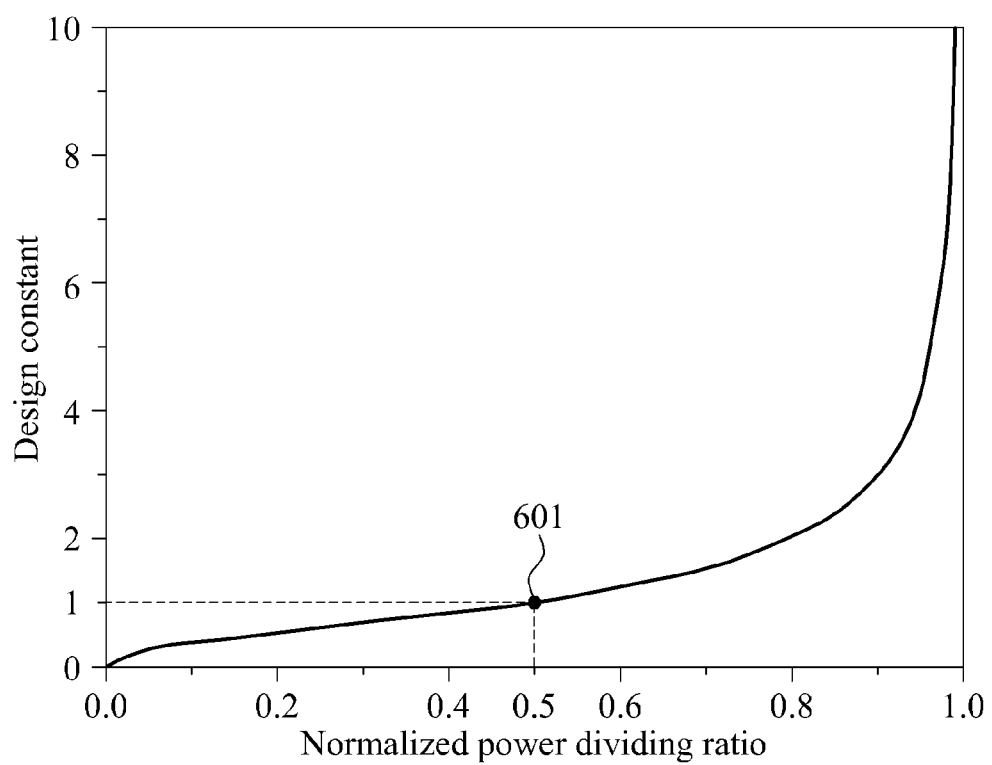
FIG. 6 is a diagram illustrating an example of a design constant of a target resonator and an amount of normalized power dividing ratio.

FIG. 6 illustrates an example of a design constant of a target resonator and an amount of normalized power dividing ratio. Referring to FIG. 6, a horizontal axis represents a normalized power dividing ratio X in Equation 4, and a vertical axis represents a design constant of a target resonator.

For example, when the normalized power dividing ratio X includes a value of 1, a power amount $P_D$ of the target resonator to be designed may include an infinite value. Referring to FIG. 6, when the normalized power dividing ratio X includes a value of 0.5, as indicated by a point 601, a design constant may be 1. When a value of the normalized power dividing ratio X is less than 0.5, the target resonator to be designed may receive a power lower than a power received by a reference device.

Accordingly, the target resonator may be designed based on information regarding the reference device. When a FOM of the target resonator satisfies Equation 4, an optimum power division may be enabled in a multi-target environment. In other words, to realize the optimum power division, the FOM of the target resonator may be designed or determined to satisfy Equation 4.

Figure 7:
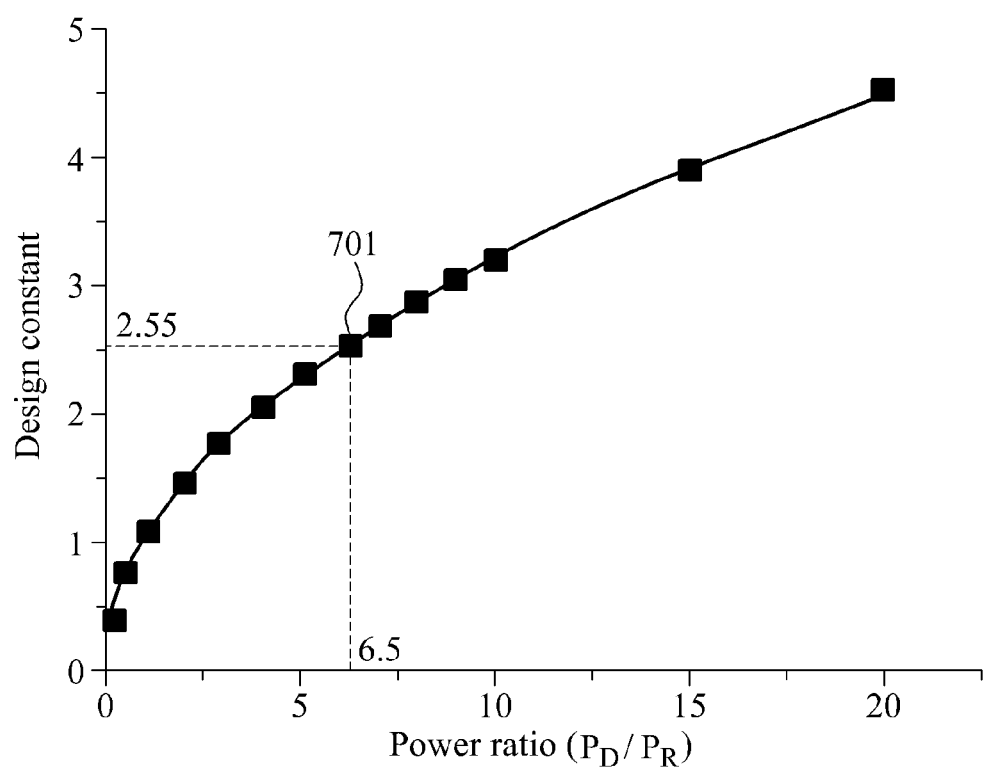
FIGS. 7 and 8 are diagrams illustrating examples of a design constant of a target resonator and a power ratio.
Figure 8:
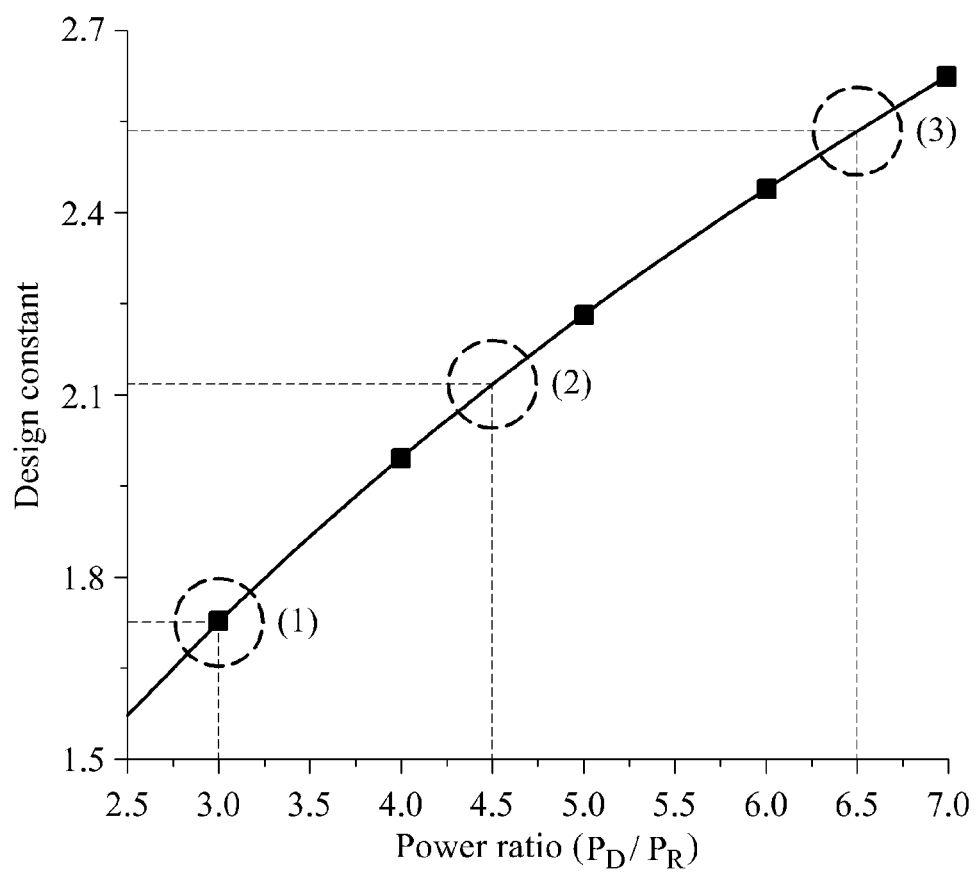

FIGS. 7 and 8 illustrate examples of a design constant of a target resonator and a power ratio. Referring to FIGS. 7 and 8, a horizontal axis represents a power ratio $P_D/P_R$ of a target device to a source device, and a vertical axis represents a design constant of a target resonator.

Graphs of FIGS. 7 and 8 may be acquired from Equations 4 through 7. For example, data shown in FIGS. 7 and 8 may be stored in a lookup table. When a value of the power ratio $P_D/P_R$ is input, a computer system may output information on a design constant matched to the value of the power ratio $P_D/P_R$.

For example, when an FOM of the target resonator includes a value within a design range, a power dividing ratio may be normally maintained. In this example, the design range is determined based on a reference FOM of a source resonator, and a design constant set in advance. When the FOM of the target resonator is beyond the design range, a power division may not be maintained normally.

Additionally, the design constant of the target resonator may include a determined value of $$\sqrt{\frac{X}{1-X}},$$

and include an error margin within 5%. In other words, the error margin $R_{design}$ of the design constant may need to satisfy the following example of Condition 1:

$$0.95 \times DC \leq R_{design} \leq 1.05 \times DC \quad \text{[Condition 1]}$$

In Condition 1, DC denotes the design constant $$\sqrt{\frac{X}{1-X}}$$

of the target resonator.

For example, referring to FIG. 7, when the power ratio is 6.5, the design constant may be 2.55, as indicated by a point 701. The design constant includes an extremely small value, compared to the power ratio, and accordingly, when the design constant is beyond the error margin, the power dividing ratio may be difficult to maintain.

Table 1 illustrates an example of a lookup table in which the data of FIGS. 7 and 8 is stored.

TABLE 1

|  | $P_D$ | $X = P_D/(P_D + P_R)$ | $DC = \sqrt{X/(1-X)}$ |
|---|---|---|---|
| Ref. | 1 | 0.5 | 1 |
| T1 | 3 | 0.75 | 1.73 |

TABLE 1-continued

| | $P_D$ | $X = P_D/(P_D + P_R)$ | $DC = \sqrt{X/(1-X)}$ |
|---|---|---|---|
| T2 | 4.5 | 0.82 | 2.12 |
| T3 | 6.5 | 0.87 | 2.55 |

Referring to Table 1 and FIG. 8, a reference device Ref requires a power of 1 W, a normalized power dividing ratio X includes a value of 0.5, and a design constant DC is 1. In an example in which a target device T1 requires a power of 3 W, the design constant DC is 1.73. In another example in which a target device T2 requires a power of 4.5 W, the design constant DC is 2.12. In still another example in which a target device T3 requires a power of 6.5 W, the design constant DC is 2.55. The reference device Ref may require a power of 1 W, a power greater than or less than 1 W, and/or both.

For example, when target resonators of target devices are designed to satisfy Table 1, a normal power division may be enabled in a multi-target environment. The normal power division may include an error margin within 15% of a power amount of each of the target devices. In an example in which a power of 2.8 W is required to smoothly charge a first target device, when a power of 2.38 W to 3.22 W is received from a source device, the first target device may be determined to receive the power that is normally divided. In another example in which power of 6 W is required to smoothly charge a second target device, when a power of 5.1 W to 6.9 W is received from the source device, the second target device may be determined to receive the power that is normally divided.

Referring to Equations 5 through 8, a value of an FOM of a target resonator may be determined by multiplication of a quality factor Q and a coupling coefficient k of the target resonator. In other words, the quality factor Q and the coupling coefficient k may be used as design parameters of the target resonator.

The quality factor Q may be adjusted based on a conductor loss of the target resonator, a conductor resistance of the target resonator, and/or an inductance of the target resonator. A value of a resonance frequency may remain unchanged. The coupling coefficient k may be adjusted based on a size of the target resonator, a thickness of a conductor included in the target resonator, and/or a width of the conductor.

Accordingly, the design parameters of the target resonator may be determined based on the FOM of the target resonator. Values of the design parameters may be combined in countless combinations, and may be determined based on Equations 5 through 8.

Figure 9:
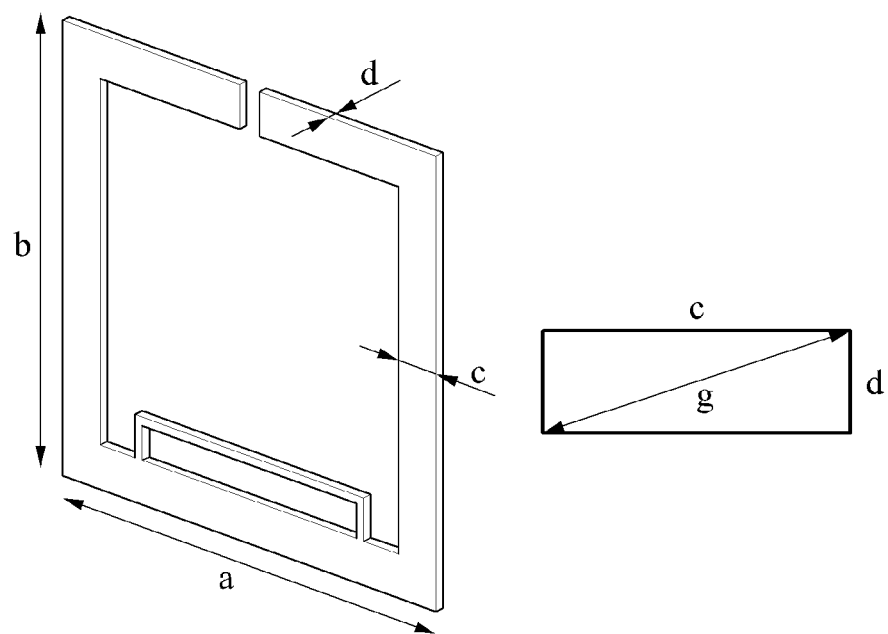
FIG. 9 is a diagram illustrating an example of a design of a target resonator.

FIG. 9 illustrates an example of a design of a target resonator. Referring to FIG. 9, the target resonator includes a shape of a rectangular loop. A FOM of the target resonator may be determined based on Equations 7 and 8.

A value of an inductance of the target resonator used to obtain the FOM may be expressed as shown in the following example of Equation 9:

$$0.02339\left((a+b) \times \log_0^{\left(\frac{2 \times ab}{cd}\right)} - a \times \log_0^{(a+g)} - b \times \log_0^{(b+g)}\right) + \quad \text{[Equation 9]}$$
$$0.01016\left(2g - \frac{a+b}{2} + 0.447(c+d)\right)$$

Referring to Equation 9, the value of the inductance of the target resonator to be designed may be adjusted based on numerical values a, b, c, d, and g associated with the shape of the target resonator. For example, a denotes a horizontal distance of the target resonator, b denotes a vertical distance of the target resonator, c denotes a horizontal thickness of the target resonator, d denotes a thickness between opposite faces of the target resonator, and g denotes a diagonal distance between the thicknesses c and d. The expression described in Equation 9 may be used to determine the value of the inductance of the rectangular loop-shaped resonator. When a resonator is designed to include a shape different from the rectangular loop, an equation, such as Equation 9, may be induced using a simulation result of the target resonator.

Figure 10:
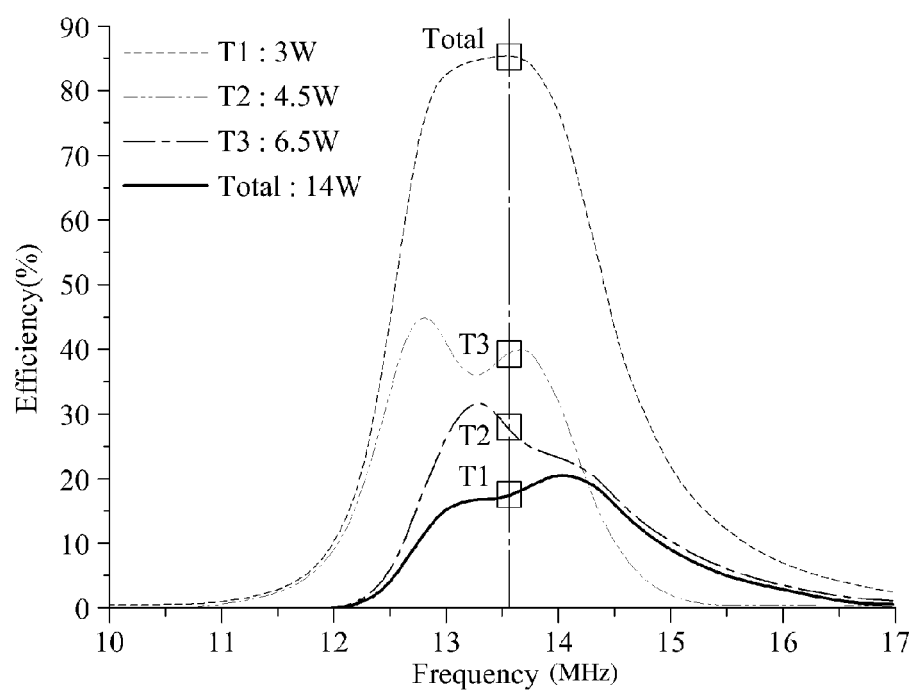
FIG. 10 is a diagram illustrating an example of a power division of target resonators.

FIG. 10 illustrates an example of a power division of target resonators. Referring to FIG. 10, T1 indicates a target device requiring a power of 3 W, T2 indicates a target device requiring a power of 4.5 W, and T3 indicates a target device requiring a power of 6.5 W. Additionally, a total amount of power transmitted by a source device is 14 W.

A target resonator of the target device T1 may include a design constant of 1, and a target resonator of the target device T2 may include a design constant of 1.73. Additionally, a target resonator of the target device T3 may include a design constant of 2.55. Due to the power division and the design constants of the target resonators, each of the target devices T1, T2, and T3 receives a power based on the respective amounts of the required power, and at optimum respective power reception efficiencies. For example, at a resonance frequency of 13.56 MHz, the target device T1 receives a power of 3 W, which corresponds to the amount of the required power, and at an optimal power reception efficiency of about 20%.

Figure 11:
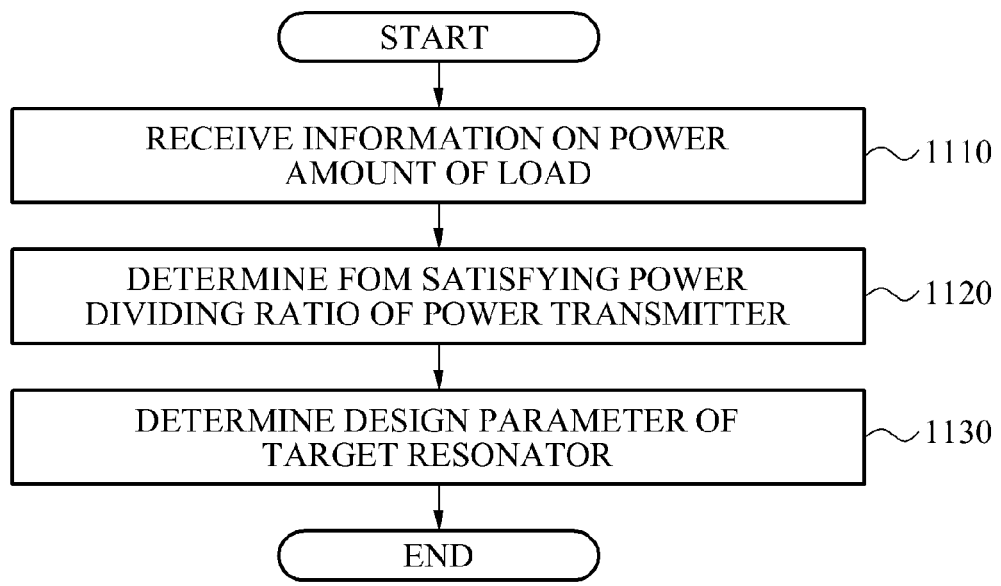
FIG. 11 is a flowchart illustrating an example of a method of designing a target resonator.

FIG. 11 illustrates an example of a method of designing a target resonator. The method of FIG. 11 may be performed by a computer system. The computer system may be operated as a design parameter determining apparatus configured to determine design parameters of the target resonator to be designed. For convenience of description, the method of FIG. 11 is assumed to be performed by a processor.

In operation 1110, the processor receives information on a power amount of a load connected to the target resonator. The information on the power amount of the load may be automatically-selected based on an input of a model name of a corresponding target device, a type of the target device, a model number of the target device, and/or other information known to one of ordinary skill in the art. For example, when a smartphone is used as the target device and includes a model number of PHY-3, a power amount of a load connected to the smartphone may be determined to be 3 W based on the mode number of PHY-3.

In operation 1120, the processor determines a FOM of the target resonator based on the received information. In this example, the FOM satisfies a power dividing ratio of a power transmitter. The FOM satisfying the power dividing ratio may be determined based on the data of FIGS. 7 and 8 and/or the data of Table 1. The FOM may be determined based on the power amount the load, a reference FOM of a source resonator of the power transmitter, and a design constant of the target resonator. Additionally, the FOM satisfying the power dividing ratio may be determined based on a type of the target resonator.

In operation 1130, the processor determines a design parameter of the target resonator based on the FOM. For example, the processor may determine and output or display a value of a quality factor Q and a value of a coupling coefficient k, of the target resonator, that are suitable for the FOM, and/or may store the values in a memory. Additionally, the processor may determine the design parameter based on the design constant. The design parameter may include, for example, a size of the target resonator, a thickness of a conductor included in the target resonator, a width of the conductor, a loss of the conductor, a resistance of the conductor, and/or an inductance value of the target resonator.

Figure 12:
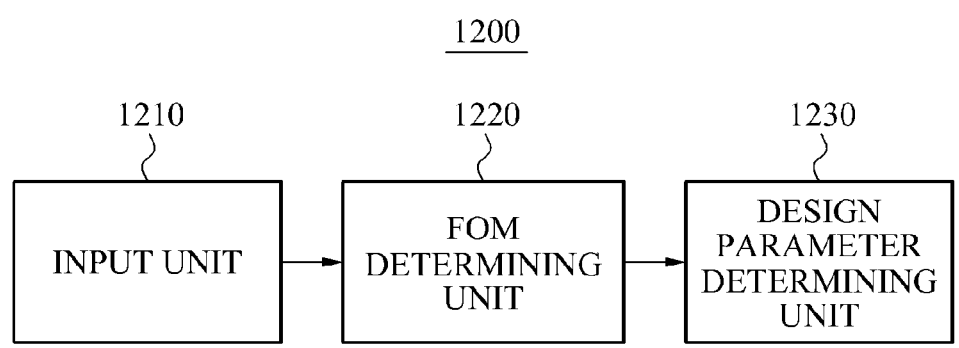
FIG. 12 is a block diagram illustrating an example of an apparatus configured to determine a design parameter of a target resonator.

FIG. 12 illustrates an example of an apparatus 1200 configured to determine a design parameter of a target resonator. The apparatus 1200 may perform the method of FIG. 11. Referring to FIG. 12, the apparatus 1200 includes an input unit 1210, a FOM determining unit 1220, and a design parameter determining unit 1230.

The input unit 1210 receives information on a power amount of a load connected to the target resonator. The input unit 1210 may include, for example, a user interface enabling a user to enter the information on the power amount of the load.

The FOM determining unit 1220 determines a FOM of the target resonator based on a lookup table and the received information on the power amount of the load. In this example, the FOM satisfies a power dividing ratio of a power transmitter. For example, the lookup table may include the data of FIGS. 7 and 8 and/or the data of Table 1. The FOM determining unit 1220 may include a memory configured to store all information required to determine the FOM, such as a reference FOM of a source resonator of the power transmitter.

The design parameter determining unit 1230 determines a design parameter of the target resonator based on the FOM. For example, the processor may determine and output or display a value of a quality factor Q and a value of a coupling coefficient k, of the target resonator, that are suitable for the FOM, and/or may store the values in a memory.

According to the teachings above, there is provided a method of designing a target resonator for optimum power division, in a wireless power transmission environment in which various target devices exist. Additionally, according to the teachings above, there is provided a target resonator for optimum wireless power transmission.

Figure 13A:
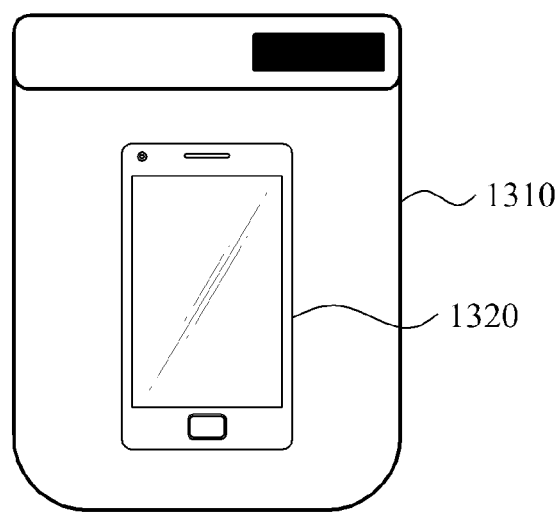
FIGS. 13A through 14B are diagrams illustrating examples of applications in which a wireless power receiver and a wireless power transmitter may be mounted.

FIGS. 13A through 14B illustrate examples of applications in which a wireless power receiver and a wireless power transmitter may be mounted. FIG. 13A illustrates an example of wireless power charging between a pad 1310 and a mobile terminal 1320, and FIG. 13B illustrates an example of wireless power charging between pads 1330 and 1340 and hearing aids 1350 and 1360, respectively.

Referring to FIG. 13A, a wireless power transmitter is mounted in the pad 1310, and a wireless power receiver is mounted in the mobile terminal 1320. The pad 1310 charges a single mobile terminal, namely, the mobile terminal 1320.

Figure 13B:
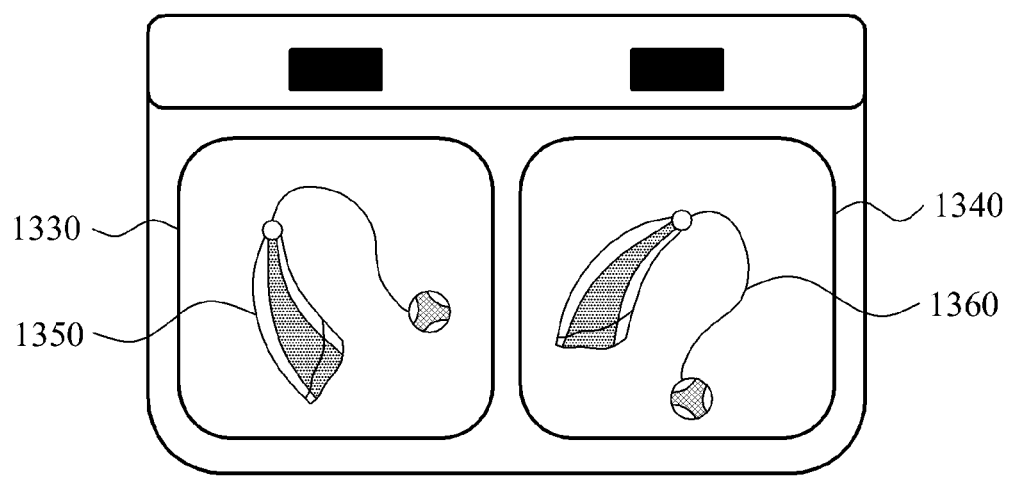

Referring to FIG. 13B, two wireless power transmitters are respectively mounted in the pads 1330 and 1340. The hearing aids 1350 and 1360 are used for a left ear and a right ear, respectively. Two wireless power receivers are respectively mounted in the hearing aids 1350 and 1360. The pads 1330 and 1340 charge two hearing aids, respectively, namely, the hearing aids 1350 and 1360.

Figure 14A:
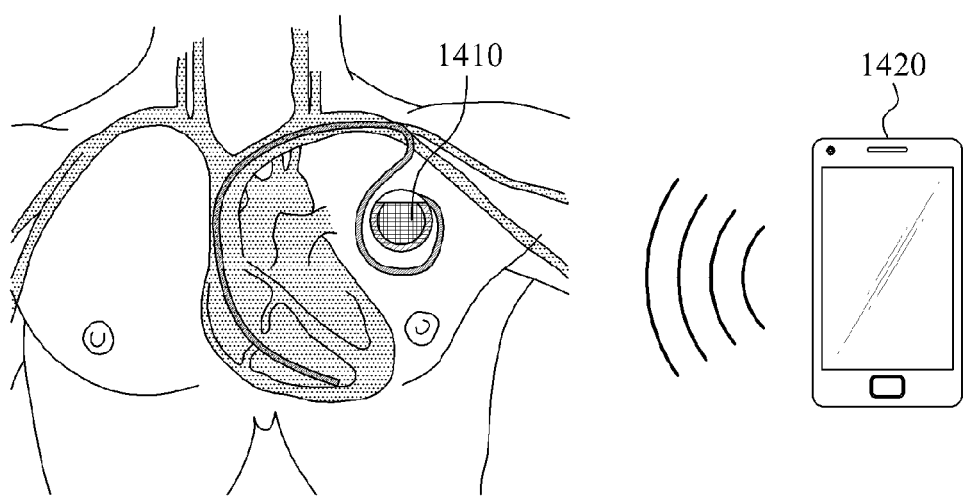
Figure 14B:
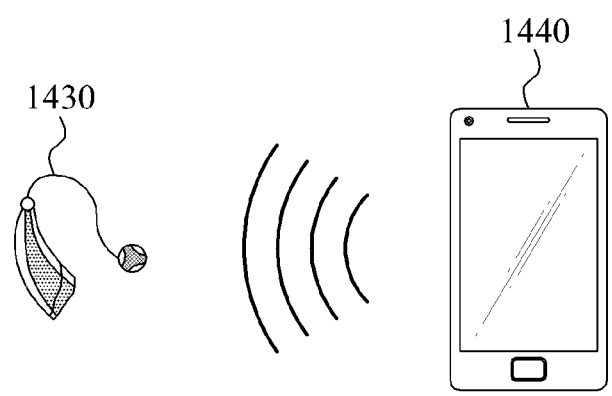

FIG. 14A illustrates an example of wireless power charging between an electronic device 1410 inserted into a human body, and a mobile terminal 1420. FIG. 14B illustrates an example of wireless power charging between a hearing aid 1430 and a mobile terminal 1440.

Referring to FIG. 14A, a wireless power transmitter and a wireless power receiver are mounted in the mobile terminal 1420. Another wireless power receiver is mounted in the electronic device 1410. The electronic device 1410 is charged by receiving a power from the mobile terminal 1420.

Referring to FIG. 14 B, a wireless power transmitter and a wireless power receiver are mounted in the mobile terminal 1440. Another wireless power receiver is mounted in the hearing aid 1430. The hearing aid 1430 is charged by receiving a power from the mobile terminal 1440. Low-power electronic devices, for example, Bluetooth earphones, may also be charged by receiving a power from the mobile terminal 1440.

Figure 15:
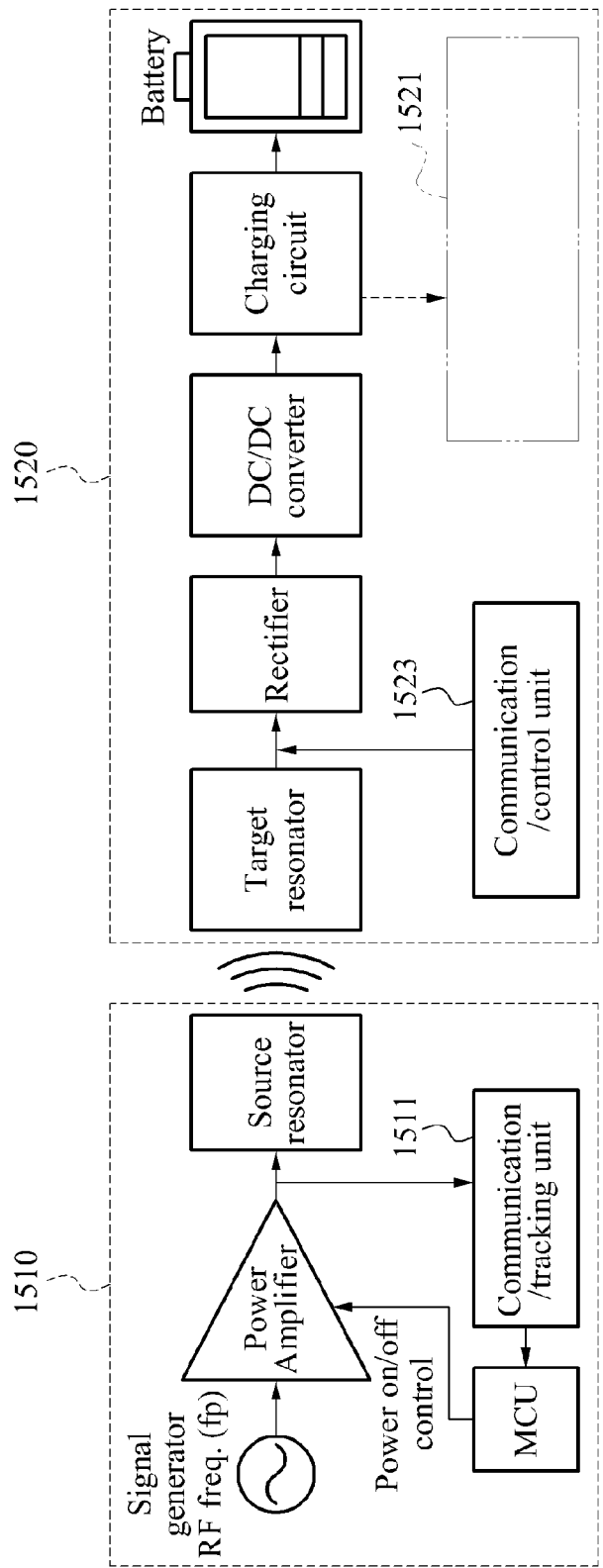
FIG. 15 is a diagram illustrating an example of a wireless power transmitter and a wireless power receiver.

FIG. 15 illustrates an example of a wireless power transmitter 1510 and a wireless power receiver 1520. The wireless power transmitter 1510 may be mounted in each of the pad 1310 of FIG. 13A and pads 1330 and 1340 of FIG. 13B. Additionally, the wireless power transmitter 1510 may be mounted in each of the mobile terminal 1420 of FIG. 14A and the mobile terminal 1440 of FIG. 14B.

In addition, the wireless power receiver 1520 may be mounted in each of the mobile terminal 1320 of FIG. 13A and the hearing aids 1350 and 1360 of FIG. 13B. Further, the wireless power receiver 1520 may be mounted in each of the electronic device 1410 of FIG. 14A and the hearing aid 1430 of FIG. 14B.

The wireless power transmitter 1510 may include a similar configuration to the source device 110 of FIG. 1. For example, the wireless power transmitter 1510 may include a unit configured to transmit a power using magnetic coupling.

Referring to FIG. 15, the wireless power transmitter 1510 includes a signal generator, a power amplifier, a microcontroller unit (MCU), a source resonator, and a communication/tracking unit 1511. The communication/tracking unit 1511 communicates with the wireless power receiver 1520, and controls an impedance and a resonance frequency to maintain a wireless power transmission efficiency. Additionally, the communication/tracking unit 1511 may perform similar functions to the power converter 114 and the control/communication unit 115 of FIG. 1.

The wireless power receiver 1520 may include a similar configuration to the target device 120 of FIG. 1. For example, the wireless power receiver 1520 may include a unit configured to wirelessly receive a power and to charge a battery.

Referring to FIG. 15, the wireless power receiver 1520 includes a target resonator, a rectifier, a DC/DC converter, and a charging circuit. Additionally, the wireless power receiver 1520 includes a communication/control unit 1523. The communication/control unit 1523 communicates with the wireless power transmitter 1510, and performs an operation to protect overvoltage and overcurrent.

The wireless power receiver 1520 may include a hearing device circuit 1521. The hearing device circuit 1521 may be charged by a battery. The hearing device circuit 1521 may include a microphone, an analog-to-digital converter (ADC), a processor, a digital-to-analog converter (DAC), and a receiver. For example, the hearing device circuit 1521 may include the same configuration as a hearing aid.

Figure 16:
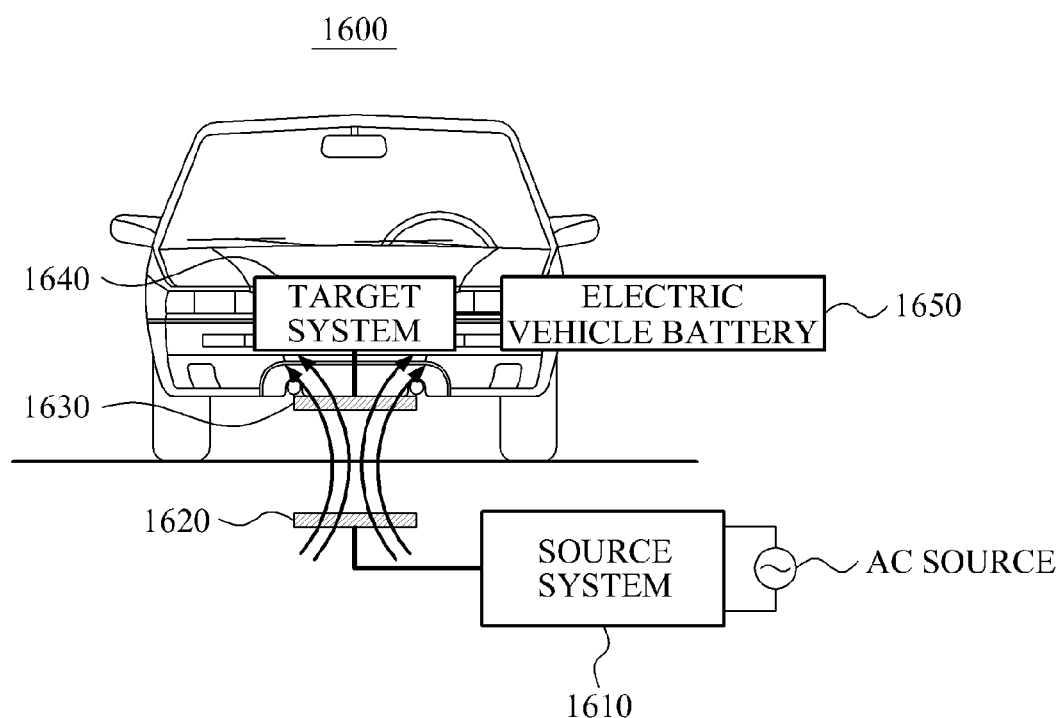
FIG. 16 is a diagram illustrating an example of an electric vehicle charging system.

FIG. 16 illustrates an example of an electric vehicle charging system. Referring to FIG. 16, an electric vehicle charging system 1600 includes a source system 1610, a source resonator 1620, a target resonator 1630, a target system 1640, and an electric vehicle battery 1650.

In one example, the electric vehicle charging system 1600 has a structure similar to the structure of the wireless power transmission system of FIG. 1. The source system 1610 and the source resonator 1620 in the electric vehicle charging system 1600 operate as a source. The target resonator 1630 and the target system 1640 in the electric vehicle charging system 1600 operate as a target.

In one example, the source system 1610 includes an alternating current-to-direct current (AC/DC) converter, a power detector, a power converter, a control and communication (control/communication) unit similar to those of the source device 110 of FIG. 1. In one example, the target system 1640 includes a rectification unit, a DC-to-DC (DC/DC) converter, a switch unit, a charging unit, and a control/communication unit similar to those of the target device 120 of FIG. 1. The electric vehicle battery 1650 is charged by the target system 1640. The electric vehicle charging system 1600 may use a resonant frequency in a band of a few kHz to tens of MHz.

The source system 1610 generates power based on a type of the vehicle being charged, a capacity of the electric vehicle battery 1650, and a charging state of the electric vehicle battery 1650, and wirelessly transmits the generated power to the target system 1640 via a magnetic coupling between the source resonator 1620 and the target resonator 1630.

The source system 1610 may control an alignment of the source resonator 1620 and the target resonator 1630. For example, when the source resonator 1620 and the target resonator 1630 are not aligned, the controller of the source system 1610 may transmit a message to the target system 1640 to control the alignment of the source resonator 1620 and the target resonator 1630.

For example, when the target resonator 1630 is not located in a position enabling maximum magnetic coupling, the source resonator 1620 and the target resonator 1630 are not properly aligned. When a vehicle does not stop at a proper position to accurately align the source resonator 1620 and the target resonator 1630, the source system 1610 may instruct a position of the vehicle to be adjusted to control the source resonator 1620 and the target resonator 1630 to be aligned. However, this is just an example, and other methods of aligning the source resonator 1620 and the target resonator 1630 may be used.

The source system 1610 and the target system 1640 may transmit or receive an ID of a vehicle and exchange various messages by performing communication with each other.

The descriptions of FIGS. 2 through 12 are also applicable to the electric vehicle charging system 1600. However, the electric vehicle charging system 1600 may use a resonant frequency in a band of a few kHz to tens of MHz, and may wirelessly transmit power that is equal to or higher than tens of watts to charge the electric vehicle battery 1650.

According to the teachings above, there are provided a resonator enabling optimum power division, and a method of designing the resonator, in a wireless power transmission environment in which various target devices exist.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments accomplishing the examples disclosed herein can be easily construed by programmers skilled in the art to which the examples pertain based on and using the flow diagrams and block diagrams of the figures and their corresponding descriptions as provided herein.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of non-transitory computer-readable storage media include magnetic media, such as hard disks, floppy disks, and magnetic tape; optical media such as CD ROM disks and DVDs; magneto-optical media, such as optical disks; and hardware devices that are configured to store and perform program instructions, such as read-only memory (ROM), random access memory (RAM), flash memory, and the like. Examples of program instructions include machine code, such as produced by a compiler, and files including higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments accomplishing the example examples disclosed herein can be easily construed by programmers skilled in the art to which the examples pertain based on and using the flow diagrams and block diagrams of the figures and their corresponding descriptions as provided herein.

As a non-exhaustive illustration only, a terminal and a device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A power receiver of a wireless power transmission system, the power receiver comprising:
    a resonator configured to wirelessly receive a power from a power transmitter; and
    a power supply configured to supply the received power to a load,
    wherein a figure of merit (FOM) of the resonator is determined based on a reference FOM of a source resonator of the power transmitter, and a constant set in advance, and
    wherein the constant comprises a value within an error margin set in advance.

2. The power receiver of claim 1, wherein the constant is defined by the following equation:

$$DC = \sqrt{\frac{X}{1-X}},$$

where $$X = \frac{P_D}{P_D + P_R},$$

and where DC denotes the constant, X denotes a power dividing ratio, $P_R$ denotes an amount of power required by a reference device, and $P_D$ denotes an amount of power required by the load.

3. The power receiver of claim 1, wherein the reference FOM is defined by the following equation:

$$U_{ref} = k_{ref}\sqrt{Q_0 Q_{ref}},$$

where $U_{ref}$ denotes the reference FOM, $k_{ref}$ denotes a coupling coefficient of a reference device, $Q_0$ denotes a quality factor of the source resonator, and $Q_{ref}$ denotes a quality factor of the reference device.

4. The power receiver of claim 1, wherein the error margin satisfies the following condition:

$$0.95 \times DC \leq R_{design} \leq 1.05 \times DC,$$

where $R_{design}$ denotes the error margin, and DC denotes the design constant.

5. The power receiver of claim 1, wherein the FOM of the resonator is defined by the following equation:

$$U_D = design constant \times U_{ref},$$

where $$DC = \sqrt{\frac{X}{1-X}},$$

where $$X = \frac{P_D}{P_D + P_R},$$

and where $U_D$ denotes the FOM of the resonator, $U_{ref}$ denotes a reference FOM of a source resonator of the power transmitter, DC denotes a constant set in advance, X denotes a power dividing ratio, $P_R$ denotes an amount of power required by a reference device, and $P_D$ denotes an amount of power required by the load.

6. The power receiver of claim 5, wherein:
    the reference FOM $U_{ref}$ is defined by the following equation $$U_{ref} = k_{ref}\sqrt{Q_0 Q_{ref}},$$

where $k_{ref}$ denotes a coupling coefficient of the reference device, $Q_0$ denotes a quality factor of the source resonator, and $Q_{ref}$ denotes a quality factor of the reference device; and
    the amount required by the reference device is 1 Watt.

7. The power receiver of claim 1, wherein:
    a power dividing ratio comprises a ratio of an amount of power required by the load to an amount of power required by a reference device, the power dividing ratio corresponding to the FOM; and
    the reference device and the power receiver receive the power at the same time.

8. The power receiver of claim 1, wherein:
    the FOM of the resonator is determined based on a ratio of an amount of power required by the load to an amount of power required by a reference device.

9. The power receiver of claim 8, wherein:
    the amount of the power required by the load comprises a value in a range of 85% to 115% of a dissipation power of the load.

10. A method of designing a resonator configured to receive a power from a power transmitter, the method comprising:
    receiving information on an amount of power required by a load connected to the resonator;
    determining a figure of merit (FOM) of the resonator based on the received information and a power dividing ratio of the power transmitter; and
    determining a design parameter of the resonator based on the FOM of the resonator,
    wherein the FOM of the resonator is determined using a reference FOM of a source resonator of the power transmitter and a constant set in advance, and
    wherein the constant comprises a value within an error marlin set in advance.

11. The method of claim 10, wherein:
    the design parameter comprises a size of the resonator, or a thickness of a conductor included in the resonator, or a width of the conductor, or a loss of the conductor, or a resistance of the conductor, or an inductance value of the resonator, or any combination thereof.

12. The method of claim 10, wherein:
    a power dividing ratio comprises a ratio of the amount of the power required by the load to an amount of power required by a reference device, the power dividing ratio corresponding to the FOM; and
    the reference device and the resonator receive the power at the same time.

13. The method of claim 10, wherein the FOM of the resonator is defined by the following equation:

$$U_D = designconstant \times U_{ref},$$

where $$DC = \sqrt{\frac{X}{1-X}},$$

where $$X = \frac{P_D}{P_D + P_R},$$

and where $U_D$ denotes the FOM of the resonator, $U_{ref}$ denotes a reference FOM of a source resonator of the power transmitter, DC denotes a constant set in advance, X denotes a power dividing ratio, $P_D$ denotes an amount of power required by a reference device, and $P_R$ denotes the amount of the power required by the load.

14. The method of claim 13, wherein:
the reference FOM $U_{ref}$ is defined by the following equation $$U_{ref} = k_{ref}\sqrt{Q_0 Q_{ref}},$$

where $k_{ref}$ denotes a coupling coefficient of the reference device, $Q_0$ denotes a quality factor of the source resonator, and $Q_{ref}$ denotes a quality factor of the reference device; and
the amount of the power required by the reference device is 1 Watt.

15. The method of claim 10, wherein the constant is defined by the following equation:

$$DC = \sqrt{\frac{X}{1-X}},$$

where $$X = \frac{P_D}{P_D + P_R},$$

and
where DC denotes the constant, X denotes a power dividing ratio, $P_R$ denotes an amount of power required by a reference device, and $P_D$ denotes the amount of the power required by the load.

16. The method of claim 10, wherein the error margin satisfies the following condition:

$$0.95 \times DC \leq R_{design} \leq 1.05 \times DC,$$

where $R_{design}$ denotes the error margin, and DC denotes the constant.

17. The method of claim 10, wherein:
the FOM of the resonator is determined based on a ratio of the amount of the power required by the load to an amount of power required by a reference device.

18. The method of claim 17, wherein:
the amount of the power required by the load comprises a value in a range of 85% to 115% of a dissipation power of the load.

19. An apparatus configured to determine a design parameter of a resonator configured to receive a power from a power transmitter, the apparatus comprising:
an input unit configured to receive information on an amount of power required by a load connected to the resonator;
a figure-of-merit (FOM) determining unit configured to determine a FOM of the resonator based on the received information and a power dividing ratio of the power transmitter; and
a design parameter determining unit configured to determine a design parameter of the resonator based on the FOM of the resonator,
wherein the FOM of the resonator is determined using a reference FOM of a source resonator of the power transmitter, and a constant set in advance, and
wherein the constant comprises a value within an error margin set in advance.

* * * * *